(12) United States Patent
Mayer et al.

(10) Patent No.: US 6,483,368 B2
(45) Date of Patent: Nov. 19, 2002

(54) ADDRESSABLE DIODE ISOLATED THIN FILM CELL ARRAY

(75) Inventors: Donald C. Mayer, Palos Verdes Estates, CA (US); Jon V. Osborn, Thousand Oaks, CA (US); Siegfried W. Janson, Redondo Beach, CA (US); Peter D. Fuqua, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 10/081,559

(22) Filed: Feb. 20, 2002

(65) Prior Publication Data

US 2002/0097079 A1 Jul. 25, 2002

Related U.S. Application Data

(63) Continuation of application No. 09/660,136, filed on Sep. 12, 2000, now Pat. No. 6,437,640.

(51) Int. Cl.[7] ............................................. H01L 21/00
(52) U.S. Cl. ..................... 327/365; 327/565; 257/776
(58) Field of Search ................................. 327/565, 365, 327/493, 504; 257/776, 758; 323/285, 351, 282; 438/132, 800, 638; 365/46, 45, 51, 54, 72, 148, 174, 175

(56) References Cited

U.S. PATENT DOCUMENTS

| 5,504,451 | A | * | 4/1996 | Smayling et al. | 327/428 |
|---|---|---|---|---|---|
| 5,723,916 | A | * | 3/1998 | Disney et al. | 123/630 |
| 6,174,803 | B1 | * | 1/2001 | Harvey | 257/758 |
| 6,194,884 | B1 | * | 2/2001 | Kesler et al. | 323/285 |
| 6,403,403 | B1 | * | 6/2002 | Mayer et al. | 327/365 |
| 6,426,680 | B1 | * | 7/2002 | Duncan et al. | 331/34 |
| 6,437,640 | B1 | * | 8/2002 | Mayer et al. | 327/565 |

* cited by examiner

Primary Examiner—Tuan H. Nguyen
Assistant Examiner—Laura M Schillinger
(74) Attorney, Agent, or Firm—Derrick Michael Reid

(57) ABSTRACT

An address element, including a polysilicon resistor functioning as a heating element and blocking diode preventing sneak current to unaddressed elements, is selectively addressed using row and column address lines in a thin film structure having a minimum number of address lines and a minimum number of layers. The resistor heater element is well suited for igniting a fuel cell such as a fuel cell in an array of fuel cells disposed in a thin film microthruster.

5 Claims, 4 Drawing Sheets

ADDRESSABLE FOUR CELL ARRAY

ADDRESSABLE FOUR CELL ARRAY

TOP VIEW OF A SINGLE ELEMENT ADDRESSABLE CELL

A - A' SIDE VIEW OF A SINGLE ELEMENT ADDRESSABLE CELL

CELL IGNITION AND INTERROGATION PROCESS

ADDRESSABLE DIODE ISOLATED THIN FILM CELL ARRAY

REFERENCE TO RELATED APPLICATION

The present application is a continuation to applicant's application entitled Diode Isolated Thin Film Array Addressing Method, Ser. No. 09/660,136 filed Sep. 12, 2000 now U.S. Pat. No. 6,437,640 by the same inventors.

FIELD OF THE INVENTION

The invention relates to the fields of thin film arrays, semiconductor processing and microthruster ignition. More particularly, the present invention relates to semiconductor processes and structures for addressing and reading thin film cell arrays well suited for igniting and interrogating semiconductor microthruster cell arrays.

STATEMENT OF GOVERNMENT INTEREST

The invention was made with Government support under contract No. F04701-93-C-0094 by the Department of the Air Force. The Government has certain rights in the invention.

BACKGROUND OF THE INVENTION

Existing cell elements, such as individual heating, pyrotechnic, thermionic, or field emitter elements disposed in an array need to be selectively addressed and activated. Electrically addressable arrays of elements using a suitable addressing scheme have been used in solid state memories. These individually addressable cells require extensive addressing connections that necessitate complicated routing during semiconductor processing. One method of addressing individual cells is to connect a pair of wires to each cell. This addressing scheme requires $2n^2$ addressing wires for an array of nxn cells. A common ground wire may be used to reduce the total to $n^2+1$ leads. Diodes have been used with addressing lines for isolated addressing. While diodes built from polycrystalline silicon films have been known for years, polysilicon diodes are not widely used because of poor reverse leakage characteristics. Crystalline silicon has been used to build electrically nonlinear elements, such as isolation diodes and complex transistors fabricated in a single crystal semiconductor substrate. These nonlinear elements have been used for selective addressing of array elements and cells.

In one application, a large array of microthruster cells, each containing heat-sensitive combustible propellant, need to be individually addressed and ignited without igniting or otherwise damaging neighboring cells. This isolated cell combustion disadvantageously requires extensive addressing lines that can be damaged and open circuited when, for example, a pyrotechnic cell is ignited resulting in a loss of addressability to a damaged neighboring unignited cell. A further disadvantage is an inability to interrogate a pyrotechnic cell to determine if the cell was properly ignited after an ignition command due to destructive combustion. The selecting and applying power to a single element of a large array of microthruster cells each containing heat-sensitive combustible propellant may not be effectively controlled without powering or disturbing neighboring cells. After the cells are ignited and destroyed by the combustion process, there is no addressing method for interrogating the ignited cells to determine whether the cells have been fired or not. These and other disadvantages are solved or reduced using the invention.

SUMMARY OF THE INVENTION

An object of the invention is to provide addressing lines for selectively addressing cells within an array of cells using diode isolation and heating resistors.

Another object of the invention is to provide addressing lines for selectively addressing cells within an array of cells using diode isolation and heating resistors using a single layer of polysilicon and a single layer of metal.

Yet another object of the invention is to provide addressing lines for selectively addressing cells within an array of cells using diode isolation and heating resistors using a single layer of polysilicon and a single layer of metal for connecting a plurality of cell elements within each cell of the array of cells.

Still another object of the invention is to provide a large array of microthruster cells containing heat sensitive combustible propellant that are individually addressed and ignited without igniting or otherwise damaging neighboring cells.

A further object of the invention is to provide a method for interrogating cells, such as combustible cells, to determine whether the cells have been previously fired.

Still a further object of the present invention is to reduce the number of addressing lines required for selective firing and interrogation of any individual cell in an array of pyrotechnic cells well suited for controlled and monitored microthrusting.

The present invention is directed to an array of uniquely addressable cells having one or more cell elements. Addressing the cells relies upon individual diode isolation for selective addressing, firing and interrogating any one of the cells using a single thin film of polycrystalline silicon. The use of an isolating diode in an addressing structure enables individual addressing of micron sized pyrotechnic elements, cells or other microelectromechanical (MEMS) devices. The addressing method is used for addressing an array of nxn cells with only 2n leads so as to simplify the manufacturing processes with efficient use of silicon area and weight well suited for addressing microthruster arrays having many cells. In the preferred form, power is applied to a selected cell in an array of cells using address lines in x- and y-directions. A thin film polysilicon diode array allows a single cell to be isolated and powered. The diode array can be manufactured using conventional photolithographic or screen printing technology and can be placed on any insulating surface. The manufacturing process is compatible with conventional MEMS systems and semiconductor processing, and the diode array can therefore be built on the same substrate material as conventional MEMS or integrated circuits.

The addressing method enables selective interrogation of individual fired pyrotechnic cells to determine whether the individual cells have been previously addressed and ignited. When ignited, the individual cell is destroyed during the combustion process that open circuits the addressed cell connections. Addressing lines are preserved by locating them between fuel cells outside the combustion zone. Current sensing, using for example a current sensing resistor in the addressing lines, can be used to determine whether a cell has been previously fired. Polysilicon diode leakage performance is sufficient to selectively address, fire and interrogate the individual cells. Polysilicon thin films can be used for addressing and firing individual cells using simple polysilicon diodes compatible with MEMS technology for process compatible integration with MEMS devices typically manufactured in polysilicon. The use of polysilicon diodes is particularly advantageous to MEMS manufacturing because polysilicon is compatible with standard HEMS surface micromachining processes as well as integrated circuit elements. These and other advantages will become more apparent from the following detailed description of the preferred embodiment.

DETAILED DESCRIPTION OF THE PREFERRED EMBODIMENT

Figure 1:
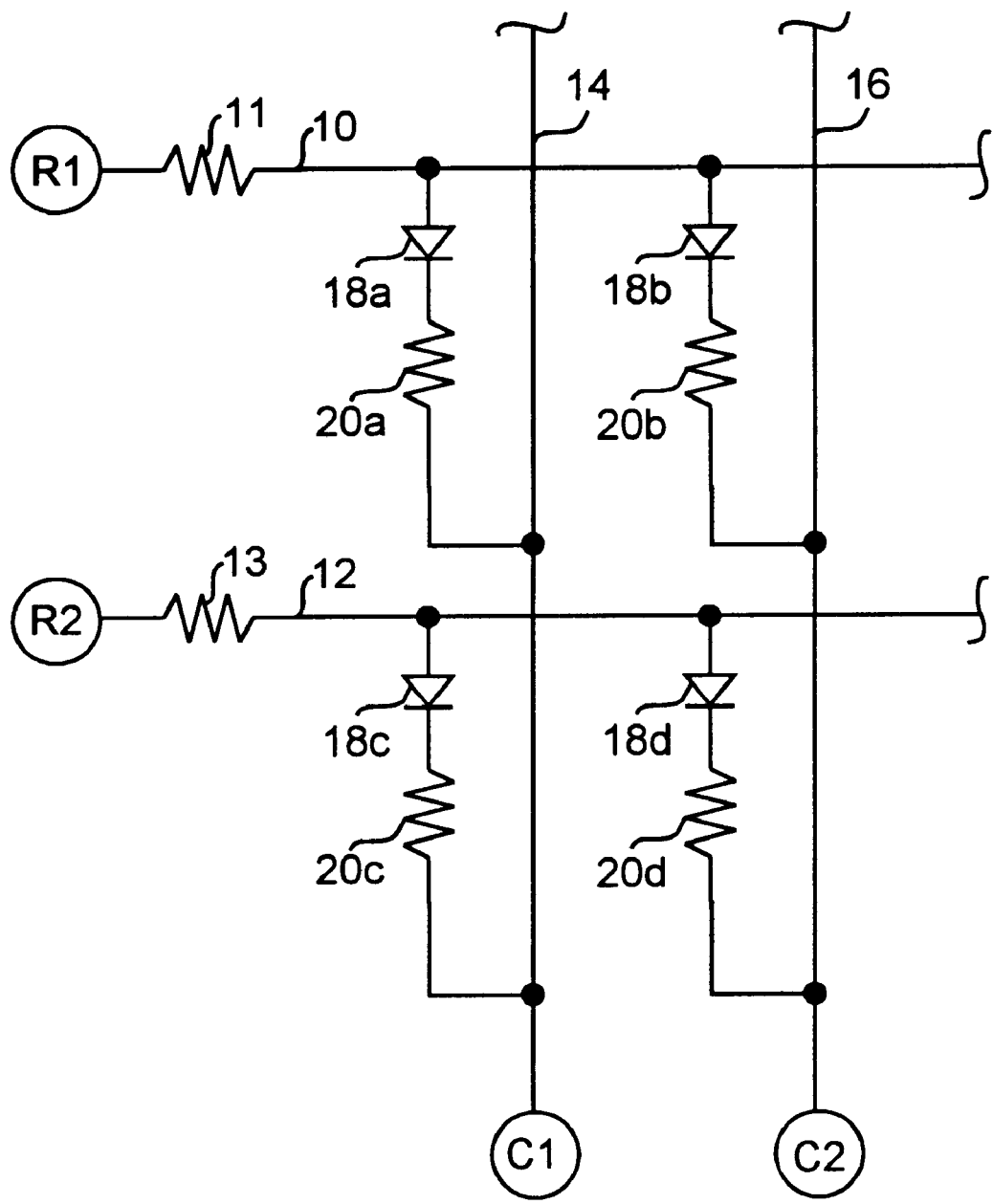
FIG. 1 is a schematic of an addressable four-cell array.

An embodiment of the invention is described with reference to the figures using reference designations as shown in the figures. Referring to FIG. 1, an addressable four cell array is shown having four addressing lines including an R1 row addressing line 10 having current sense resistor 11, an R2 row addressing line 12 having current sense resistor 13, a C1 column addressing line 14 and a C2 column addressing line 16. The row addressing lines 10 and 12, are respectively connected to rows of diodes, such as diodes 18a and 18b, and 18c and 18d, that are in turn, respectively connected to resistive elements, such as resistors 20a and 20b, and 20c and 20d. The diodes 18abcd and resistors 20abcd combine to define four respective single element cells.

Electrically powered cells are represented by resistors 20abcd and diodes 18abcd in an array aligned in rows and columns with common connections along each row or column. A specific cell is selected and powered by applying a voltage across the selected row and column lines for dropping a voltage potential from a row to a column. When selecting a cell, current flows through one of the diodes 18abcd and through a respective one of the resistors 20abcd. All other rows and columns are allowed to electrically float in open circuit. The diodes 18abcd and resistors 20abcd are connected in series within each cell element in order to prevent current from flowing along sneak paths through unselected cells. For example, when a positive voltage is applied to the R2 row addressing line 12 with the C1 column addressing line 14 grounded, current may flow through a sneak path from the R2 addressing line 12 through resistor 20d, along C2 line 16, through the resistor 20b, along the R1 line 10, through resistor 20a and then to the grounded C1 line 16. In this sneak path example, the diode 18b blocks the flow of current through the unselected cells having respective resistors 20abd, and allows current to flow only through the resistor 20c of the selected cell between the R2 line 12 and the C1 line 14.

Figure 2:
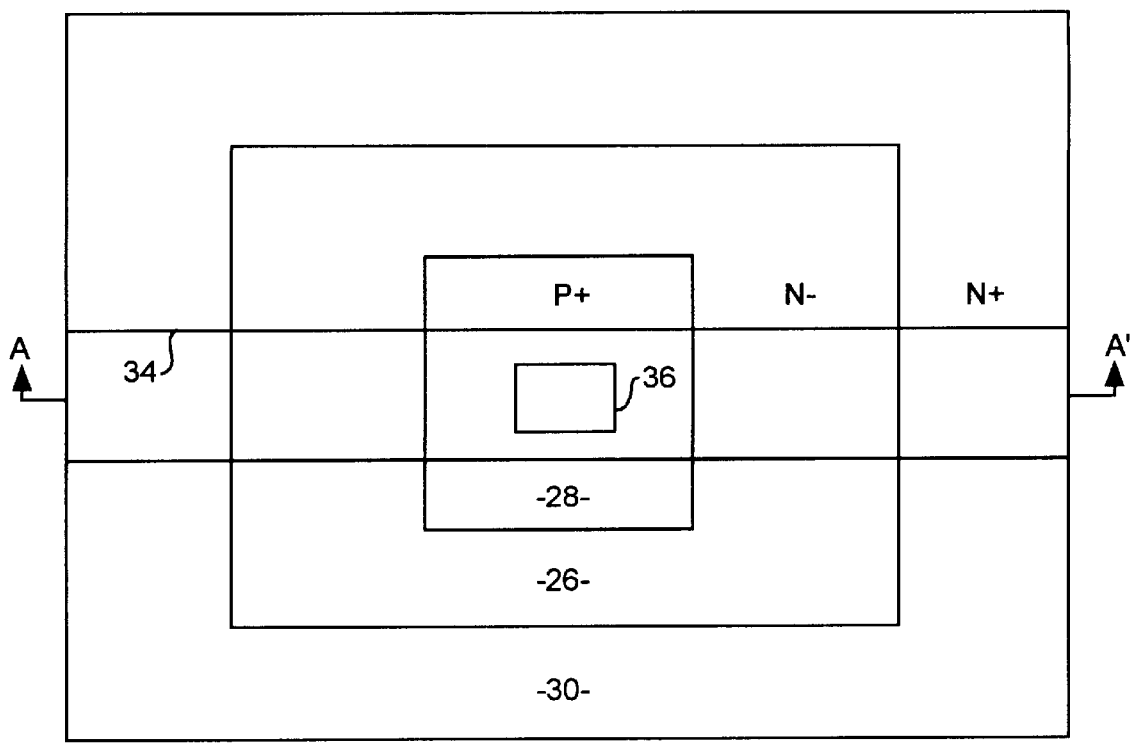
FIG. 2 is a top view of a single element addressable cell.
Figure 3:
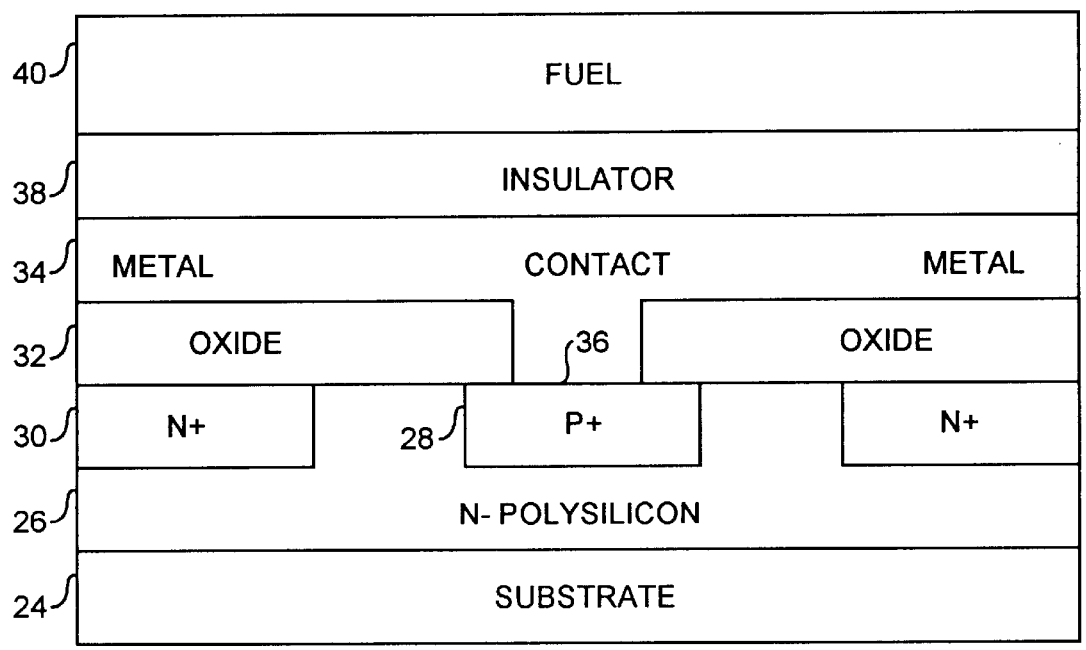
FIG. 3 is an A–A' side view of the single element addressable array.

Referring to FIGS. 1, 2 and 3, and more particularly to FIGS. 2 and 3, a microthruster array of cells can be manufactured using thin film processes on a substrate 24 using a single polysilicon layer 26. The layer 26 is preferably an N– polysilicon layer 26 that is deposited on the substrate 24. The N– polysilicon layer 26 has inherent resistivity well suited for conveniently forming resistors 20abcd that become heated when conducting current. An N+ region 30 is formed in the layer 26 for forming the addressing row lines, such as row lines 10 and 12. A P+ region is formed in the layer 26 for forming diodes, such as diodes 18abcd. The P+ region is used to form P-N junctions of the diodes 18abcd. A diode P-N junction is formed at an interface between the P+ region 28 and N– polysilicon layer 26. Over the polysilicon layer 26 is deposited an insulation layer 32, such as a silicon oxide layer. A metal layer 34 is then deposited over the insulation layer 32 having a contact 36 formed by etching through the insulation layer 32. The metalization layer 34 is deposited over the insulation layer 32 for forming column addressing lines, such as C1 line 14 and C2 lines 16, with metal coming into contact with the P+ region through the contact feed through 36 between the diode junctions 18abcd and the column address line 14 or 16 of metal layer 34. Another insulation layer 38 is deposited over metal layer 34 and more particularly over the contact 36. The insulation layer 38 may be thin or may not be used at all when the fuel is preferably electrically nonconductive and noncorrosive. A fuel cell 40 may then be deposited over the insulation layer 38 that is electrically isolated from the metal layer 34. The fuel cell 40 is a packet of combustible fuel in a cavity in the fuel cell layer, the cavities being formed over the insulation layer 38 or metal layer 34. The fuel cell 40 may be one of many fuel cells or packets in a fuel cell layer. The preferred addressable array can be manufactured using conventional semiconductor and microthruster manufacturing processes.

There are several differing embodiments possible of the structure of the addressable array. For example, when the P+ region 28 is omitted from the polysilicon layer 26, a Schottky barrier diode is then created instead at the junction between the metal layer 34 and the N– polysilicon layer 26, but Schottky barrier diodes are subject to enhanced leakage and are incompatible with some conducting metals, such as silver and gold that are often used in semiconductor processes due to inherent superior conductivity. For another example, the N– polysilicon layer 26, N+ region 30 and P+ region 28 could be reversed by providing a P– polysilicon layer, P+ region and N+ region, respectively, but with the polarity of the voltages on the row and column lines 10, 12, 14 and 16 being reversed during operation, as an equivalent cell in structure and operation.

Figure 4:
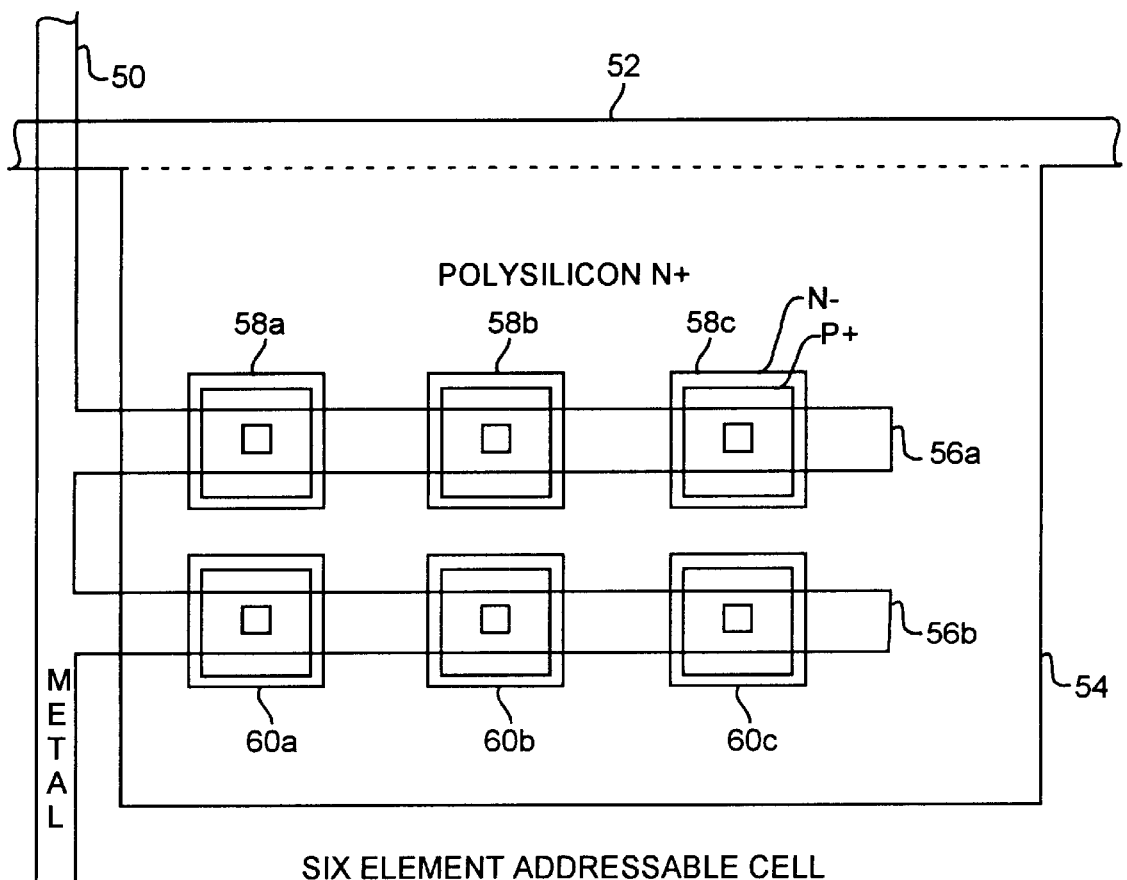
FIG. 4 is a top view of a six element addressable array.

Referring to FIGS. 1, 2, 3 and 4, and more particularly FIG. 4, a six element addressable cell is shown having a metal column address line 50, an N+ polysilicon row address line 52, a polysilicon N+ cell pad 54, first and second metal fingers 56a and 56b respectively, first finger elements 58a, 58b and 58c, and second finger elements 60a, 60b and 60c. The elements 58abc and 60abc have respective resistors, such as resistors 20abcd in polysilicon pad 54 that are heated when conducting current between the row line 52 and the column line 50. The multiple finger arrangement enables the creation of a matrix of aligned multiple parallel elements forming a single cell and effectively forms a single resistor, such as resistor 20a of the single cell with such resistor having controlled resistance for rapid heating and controlled firing of the fuel cell 40. A single addressable cell can have a single diode 20 and resistor 18, or multiple diodes and resistors connected in serial, parallel, or serial/parallel combination to control the resistance of the heating resistors in each addressable cell. The shape and size of the resistor 18 can also be adjusted to control the resistance of the heating resistors. The elements 58abc and 60abc also form respective diodes, such as diodes 20abcd formed at respective junctions of the N– polysilicon pad 54 of layer 26 and the respective P+ regions 36 of the polysilicon pad 54. The heated equivalent resistor of the cell comprising elements 58abc and 60abc is used to ignite the propellant filled cell 40 above the elements 58abc and 60abc. Combustion of the propellant in the fuel cell causes propellant gases to be expelled creating a propulsive impulse from the cell within an array in the direction normal to the surface of the fuel cell 40. By incorporating the diodes 18abcd into the array, and designing the cell elements and array spacing properly, no current is conducted in the adjacent cells, and no inadvertent damage occurs to cells during combustion of an adjacent combusting cell. Hence, the addressing lines and cell elements can be suitably spaced for accurate controlled firing of any one of the fuel cells 40. The fuel cells 40 have combustible fuel in proximity to the resistors 18abcd being heated by conducting current when the ignition voltage is applied across the respective addressing lines so as to address an individual fuel cell and ignite the combustible fuel in the cell. The ignition voltage is applied across a respective resistor and provides sufficient current and resultant heating of the respective resistor in order to assuredly ignite the fuel of the fuel cell 40 in proximity to the respective resistor. In practice, the combustion process of the fuel cell may be by thermal conduction from the heating resistor to the fuel cell, by shock wave generation into the fuel cell caused by vaporization of the heating resistor, or by any other method that causes combustion of the fuel in the fuel cell.

The processes for manufacturing the addressing lines 10, 12, 14, 16, 34, 30, 50, and 52, and the diodes 18abcd and resistors 20abcd formed in the polysilicon layer 26 provide for semiconductor process compatibility with surface micromachined MEMS devices and other types of integrable electronic devices. The diodes 18abcd and resistor 20abcd are formed in the polycrystalline silicon thin film layer 26 deposited over the substrate 24 that may include single-crystal bulk silicon within which control or signal processing electronic circuits may also be manufactured as well as MEMS devices. The layers 26 in which the diodes 18abcd and resistors 20abcd are form may be used, along with other deposited surface layers, not shown, to fabricate MEMS structures on a common substrate. However, particular care should be taken in designing and manufacturing high quality diodes in polysilicon because of the short minority carrier lifetimes that can lead to large reverse leakage currents. Also, manufacturing-related thermal cycling can cause enhanced diffusion of the N and P dopants along polysilicon grain boundaries that can result in a dramatically reduced reverse breakdown voltage or even a shorted diode. Those skilled in the arts of semiconductor processing and MEMS manufacturing are well adept at forming such MEMS and electronic devices over the substrate 24 having a polysilicon layer 26.

The construction of the array using fuel cells 40 can be used as part of a micropropulsion system, not shown, necessary for propulsion and attitude control in miniaturized spacecraft. The use of the addressing lines 10, 12, 14, 16, 34, 30, 50, and 52, and the diodes 18abcd and resistors 20abcd formed in the polysilicon layer further enables the interrogation of any one fuel cell for accurate determination and monitoring of fuel usage of a microthruster comprising an array of fuel cells 40. The current sensors, such as sense resistors 11 and 13, are attached to the address lines, such as row address lines 10 and 12 respectively. An interrogation voltage, which is preferably substantially less than the ignition voltage, is applied to the row and column address lines, such as the R2 line 12 and the C1 column line 14. Monitoring current through sense resistors, such as resistor 13, can be measured. If the cell has been previously addressed and ignited, the diode and underlying polysilicon will be damaged and the circuit comprising, for example, diode 18c and resistor 20c will be damaged and opened circuited. The fuel cells 40 are of a suitable size so as to provide an impulse of microthrust upon combustion, as well as sufficient energy so as to open circuit the cell element, including, for example, the resistor 18c to diode 20c connection so as to prevent further current flow through the element 18c and 20c. When opened circuited, no current will flow through resistor 18c and diode 20c. Under incomplete open circuiting after cell combustion, some leakage current may still flow through the element, but the sense voltage across the sense resistor would then be small. A suitably chosen preferred threshold voltage is compared to the sense voltage to determine when a cell has been fired. By sensing whether current is flowing in the address lines, for example, the R2 row address line, at any address within an array, a determination can be made whether the addressed cell has been fired. In so doing, computer processes can control precise firing of the cells, and therefore control thrusting of the microthruster, verify cell combustion, and monitor fuel usage.

Figure 5:
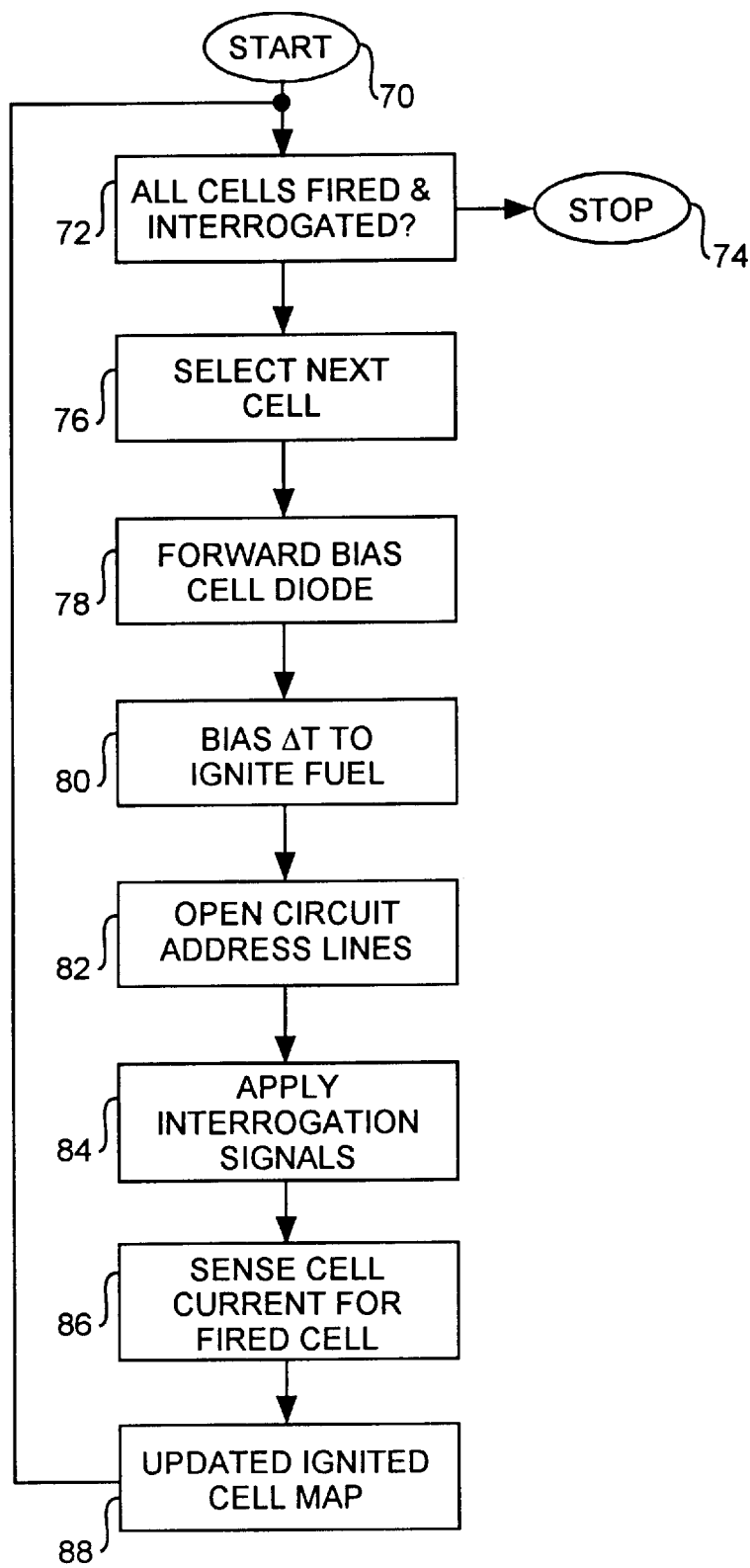
FIG. 5 is a cell ignition and interrogation process

Referring to FIG. 5, an exemplar cell ignition and monitoring process starts 70 with determining when all of the cells have been fired through interrogation 72, and if so, then the fuel is spent and fuel monitoring may stop 74. Otherwise, another next cell is selected 76 by addressing through forward biasing an addressed resistor and diode 78 when applying an ignition voltage that heats the addressed resistor for igniting 80 the cell. During combustion, the addressing lines of the addressed resistor and addressed diode 82 are damaged and become open circuited. An interrogation voltage can be applied 84 to an addressed cell to determine if the cell had been ignited. Preferably, an interrogation sensing current flowing through a sensing resistor provides the sensing voltage that is sensed 86, and when below a predetermined threshold, the sensing voltage indicates combustion of the addressed cell. Typically and preferably, the explosive force of combustion of a fuel cell will cause an open circuit between the selected row and column addressing lines, most probably due to open circuiting 88 and damaging of the addressed resistor and addressed diode. In the preferred form, a monitoring computer, not shown, can maintain and update a cell map in memory having locations for the respective cells. The cell map is updated 88 to reflect the number of fired fuel cells of the array of fuel cells. The igniting and interrogation of each cell in the array may be repeated until all of the fuel is expended.

The layer 26 is preferably polysilicon for fabricating the resistor 20 and diode 18. The polysilicon layer is the preferred material for the resistor 20 due to localized heat generation suitable for firing the fuel cell, but other heat generating conducting materials could be used for the resistor. The polysilicon diodes could be equivalently replaced using a like functioning layer having interconnections to the addressing lines. For example, the diodes 18abcd could be built in a single crystal substrate such as the silicon substrate 24 and connected by way of metal feeds to the polysilicon resistors 20abcd.

In an alternate embodiment, the N+ polysilicon region 30 and P+ polysilicon region 28 could be covered with a conductive layer, such as a metal or a silicide layer, aligned to the N+ and P+ regions, to reduce the resistance of the row address lines 10 and 12. In an alternate embodiment, the heating resistors 18 could be replaced by field emitters, or mechanical actuating devices, or another actuating device appropriate for an alternate application. In another alternate embodiment, the fuel cells 40 could be replaced by a micromirror, a microswitch, or another actuated MEMS device appropriate for an alternate application.

The compact design of the addressing lines offers reduced size and cost savings well suited for various applications such as addressable picture elements in television screens, monitors, and printers. More specifically, the compact design is well suited for use in infrared dynamic scene generators, flat screen televisions, inkjet print heads, backward wave oscillators, high power vacuum tubes, and travelling wave tubes. The design further can be used in microthruster applications. Those skilled in the art can make enhancements, improvements, and modifications to the invention, and these enhancements, improvements, and modifications may nonetheless fall within the spirit and scope of the following claims.

What is claimed is:

1. An array of cells individually addressable by row addressing lines and by column addressing lines, the cell comprising:

A substrate for supporting the array of cells,

A polysilicon layer disposed on the substrate, the polysilicon layer for forming an array of resistors for the respective cells, the polysilicon layer for forming an array of diodes for the respective cells, the polysilicon layer for connecting together the array of resistors and the array of diodes, the polysilicon layer for forming and respectively connecting the row addressing lines to the array of resistors, An insulating layer disposed on the polysilicon layer for insulating the polysilicon layer, the insulating layer comprising an array of feed throughs extending to the polysilicon layer, and A conducting layer disposed on the insulating layer for forming the column addressing lines respectively connected to the polysilicon layer through the array of feed throughs for respectively connecting the column addressing lines to the array of diodes, and A fuel layer comprising an array of fuel packets containing combustible fuel in respective proximity to the array of resistors the array of resistors being respectively heated when conducting current when an ignition voltage is applied across a respective one of the row addressing lines and a respective one of the column addressing films and a respective one cell of the array of cells for igniting a respective one of the array of fuel packets.

2. The array of cells of claim 1, wherein the polysilicon layer is an N– doped polysilicon layer, the polysilicon layer comprises an array of N+ doped regions serving to respectively connect the row addressing lines to the array of resistors, and the polysilicon layer comprises an array of P+ doped regions connected to the conducting layer, the array of P+ doped region interfaces with remaining portions of the N– polysilicon layer for forming an array of P-N junctions of the array of diodes in the polysilicon layer.

3. The array of cells of claim 1 wherein, the insulating layer is an oxide layer, and the conducting layer is a metal layer.

4. The array of cells of claim 1, wherein, each of the cells comprise multiple elements, each of the respective feed throughs comprise respective multiple feed throughs in the insulation layer, and the polysilicon layer comprises multiple pad portions for each of the cells, each of multiple pad portions for supporting the multiple elements, the multiple elements comprise the respective resistor and the respective diode for the respective cell, the respective resistor is formed from respective multiple resistors in the pad portion serving to connect the respective multiple resistors to the respective row addressing line through the pad portion, the respective diode is formed from respective multiple diodes connected to the respective column addressing line of the conducting layer.

5. The array of cells of claim 4 wherein the multiple elements are arranged in a matrix, and the conducting layer comprises conducting fingers each connected to a plurality of elements of the multiple elements, the plurality of elements being aligned within the matrix.

* * * * *